(12) United States Patent
Hyung et al.

(10) Patent No.: US 8,828,631 B2
(45) Date of Patent: Sep. 9, 2014

(54) PIGMENT DISPERSION COMPOSITION, PHOTOSENSITIVE RESIN COMPOSITION INCLUDING THE SAME AND COLOR FILTER USING THE SAME

(75) Inventors: Kyung-Hee Hyung, Uiwang-si (KR); Taek-Jin Baek, Uiwang-si (KR); Eui-June Jeong, Uiwang-si (KR); Jae-Hyun Kim, Uiwang-si (KR); Gyu-Seok Han, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 13/591,484

(22) Filed: Aug. 22, 2012

(65) Prior Publication Data

US 2013/0164681 A1    Jun. 27, 2013

(30) Foreign Application Priority Data

Dec. 26, 2011    (KR) .................. 10-2011-0142466

(51) Int. Cl.
  *G03F 7/004*    (2006.01)
  *G02B 5/20*    (2006.01)

(52) U.S. Cl.
  USPC .......... 430/7; 430/270.1; 430/283.1; 106/493

(58) Field of Classification Search
  None
  See application file for complete search history.

(56) References Cited

U.S. PATENT DOCUMENTS

| | | |
|---|---|---|
| 6,864,022 B2 | 3/2005 | Machiguchi et al. |
| 7,193,068 B2 | 3/2007 | Araki et al. |
| 7,572,559 B2 | 8/2009 | Araki |
| 2008/0254634 A1 | 10/2008 | Park et al. |

FOREIGN PATENT DOCUMENTS

| | | |
|---|---|---|
| CN | 1834795 A | 9/2006 |
| CN | 102276589 A | 12/2011 |
| JP | 2002-014223 A | 1/2002 |
| JP | 2007-057658 A * | 3/2007 |
| KR | 10-1996-7003246 | 6/1996 |
| KR | 10-2006-0050015 A | 5/2006 |
| KR | 2012-0071742 * | 7/2012 |
| WO | 95/00885 | 1/1995 |

OTHER PUBLICATIONS

Computer-generated translation of KR 2012-0071742 (Jul. 2012).*
Computer-generated translation of JP 2007-057658 (Mar. 2007).*
Search Report in counterpart Chinese Application No. 201210251567.7 dated Feb. 14, 2014, pp. 1-2.
English-translation of Search Report in counterpart Chinese Application No. 201210251567.7 dated Feb. 14, 2014, pp. 1-2.

* cited by examiner

*Primary Examiner* — John A. McPherson
(74) *Attorney, Agent, or Firm* — Additon, Higgins & Pendleton, P.A.

(57) ABSTRACT

Disclosed are a pigment dispersion composition including a pyridone azo-based compound including a monomer represented by the following Chemical Formula 1, a polymer including a repeating unit represented by the following Chemical Formula 2, or a combination thereof, wherein each substituents of Chemical Formulae 1 and 2 are the same as defined the detailed description, (B) a pigment, (C) a binder resin, (D) a dispersing agent, and (E) a solvent; a photosensitive resin composition including the same; and a color filter including the same.

[Chemical Formula 1]

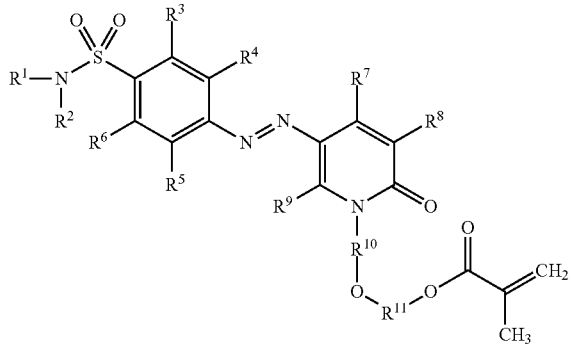

[Chemical Formula 2]

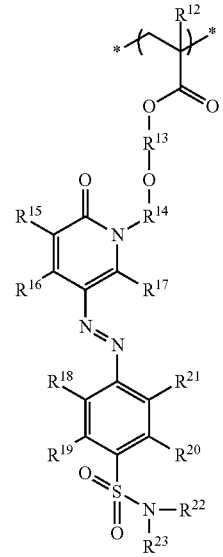

17 Claims, No Drawings

PIGMENT DISPERSION COMPOSITION, PHOTOSENSITIVE RESIN COMPOSITION INCLUDING THE SAME AND COLOR FILTER USING THE SAME

CROSS-REFERENCE TO RELATED APPLICATION

This application claims priority to and the benefit of Korean Patent Application No. 10-2011-0142466 filed in the Korean Intellectual Property Office on Dec. 26, 2011, the entire disclosure of which is incorporated herein by reference.

FIELD

This disclosure relates to a pigment dispersion composition, a photosensitive resin composition including the same, and a color filter using the same.

BACKGROUND

Color filters are used as optical filters for various electronic products, such as liquid crystal displays (LCDs), cameras, and the like. Color filters are thin film-type optical parts extracting more than 3 colors from white light and forming fine pixel units. The pixels have a size of tens to hundreds of micrometers. Color filters can have a laminate structure including a black matrix layer with a predetermined pattern to block the boundary between pixels and a pixel region including three primary colors of red (G), green (G), and blue (B) sequentially arranged in a predetermined order on a transparent substrate.

Generally, a color filter may be fabricated by coating three or more colors on a transparent substrate by dyeing, electrophoretic deposition, printing, or pigment dispersion. Currently pigment dispersion using a pigment-dispersible color resist is typically used.

The pigment dispersion method can form a colored film by repeating a series of processes such as coating, exposing to a light, developing, and curing a photopolymerizable composition including a coloring agent on a transparent substrate including a black matrix. The pigment dispersion method can improve heat resistance and durability, which are very important characteristics for a color filter, and can provide a film with a uniform thickness. Therefore, the pigment dispersion method is widely used.

Recently, there is an increasing demand for large liquid crystal displays (LCDs) with high luminance and a high contrast ratio. To satisfy these requirements, however, color reproducibility of a color filter may be deteriorated.

SUMMARY

One embodiment provides a pigment dispersion composition that can have excellent chemical resistance, heat resistance, and light resistance as well as dispersion stability and coloring properties.

Another embodiment provides a photosensitive resin composition including the pigment dispersion composition.

Yet another embodiment provides a color filter that can have excellent color reproducibility and high luminance and high contrast ratio by using the photosensitive resin composition.

According to one embodiment, provided is a pigment dispersion composition that includes (A) at least one pyridone azo-based compound including a monomer represented by the following Chemical Formula 1, a polymer including a repeating unit represented by the following Chemical Formula 2, or a combination thereof; (B) a pigment; (C) a binder resin; (D) a dispersing agent; and (E) a solvent.

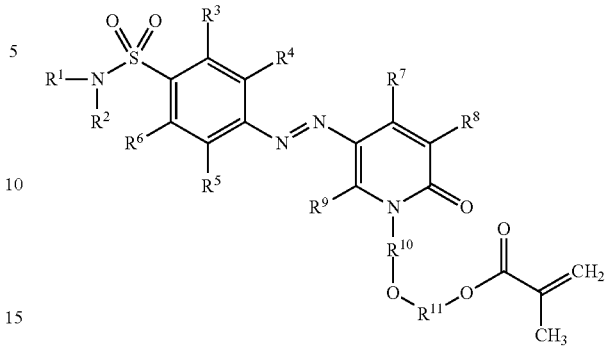

[Chemical Formula 1]

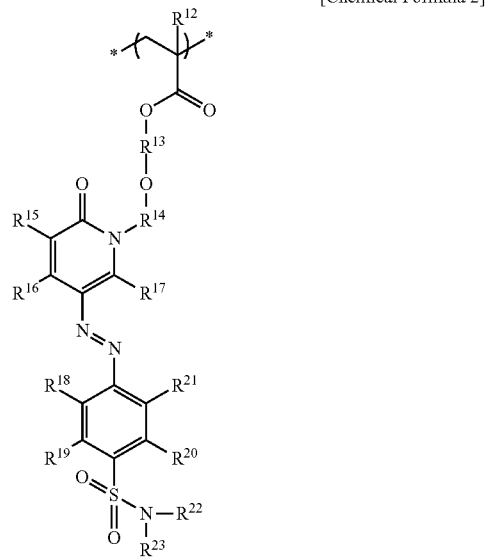

[Chemical Formula 2]

In Chemical Formulae 1 and 2, $R^1$ and $R^{22}$ are each independently hydrogen, substituted or unsubstituted C1 to C12 alkyl, a vinyl group, an amino group, a carboxyl group, or a phosphate group, $R^2$, $R^3$ to $R^6$, $R^{18}$ to $R^{21}$ and $R^{23}$ are each independently hydrogen, substituted or unsubstituted C1 to C20 alkyl, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl, $R^7$ to $R^9$ and $R^{15}$ to $R^{17}$ are each independently hydrogen, substituted or unsubstituted C1 to C4 alkyl, a hydroxy group, a cyano group, or a carboxyl group, $R^{10}$, $R^{11}$, $R^{13}$ and $R^{14}$ are each independently substituted or unsubstituted C1 to C12 alkylene, substituted or unsubstituted C6 to C30 arylene, substituted or unsubstituted alkylenearylene, or substituted or unsubstituted arylenealkylene, and $R^{12}$ is hydrogen, substituted or unsubstituted C1 to C20 alkyl, substituted or unsubstituted C6 to C30 aryl, substituted or unsubstituted alkylenearyl, substituted or unsubstituted arylenealkyl, or substituted or unsubstituted C3 to C20 cycloalkyl.

The polymer including a repeating unit represented by Chemical Formula 2 may further include at least one repeating unit selected from the following Chemical Formula 3, the following Chemical Formula 4, or a combination thereof.

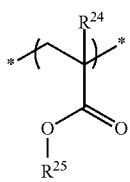

[Chemical Formula 3]

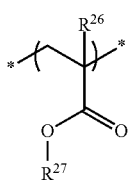

[Chemical Formula 4]

In Chemical Formulae 3 and 4, $R^{24}$ and $R^{26}$ are each independently hydrogen, substituted or unsubstituted C1 to C20 alkyl, substituted or unsubstituted C6 to C30 aryl, substituted or unsubstituted alkylenearyl, substituted or unsubstituted arylenealkyl, or substituted or unsubstituted C3 to C20 cycloalkyl, and $R^{25}$ and $R^{27}$ are different and are each independently hydrogen, halogen, hydroxy, substituted or unsubstituted C1 to C20 alkoxy, substituted or unsubstituted C1 to C20 alkyl, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, substituted or unsubstituted C6 to C30 oxyaryl, or an amino group.

The repeating unit represented by Chemical Formula 2 may be present in an amount of about 20 mol % to about 80 mol % based on the total amount of the polymer.

The polymer may have a weight average molecular weight of about 3,000 to about 50,000 g/mol.

The polymer may have an acid value of about 20 to about 200 mgKOH/g.

The pyridone azo-based compound may include at least one compound including a monomer represented by the following Chemical Formula 5, a polymer including a repeating unit represented by the following Chemical Formula 6, or a combination thereof.

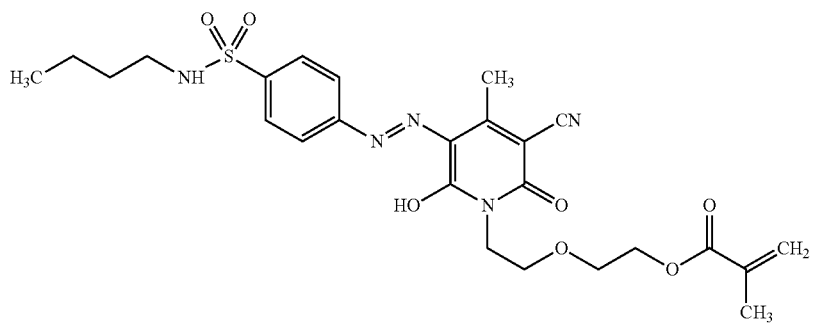

[Chemical Formula 5]

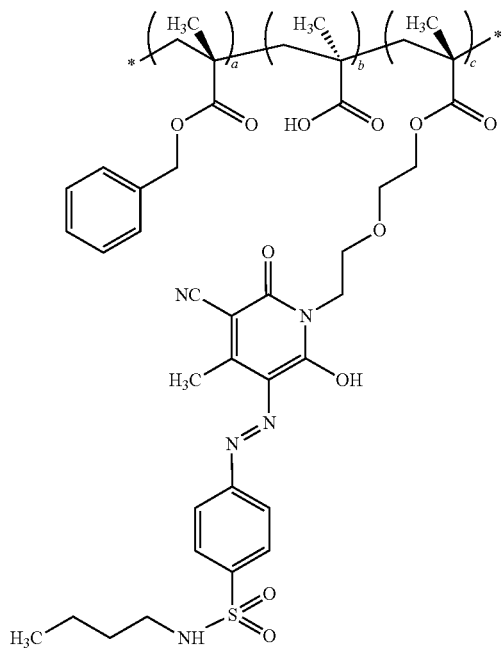

[Chemical Formula 6]

In Chemical Formula 6, a is an integer ranging from 1 to 100, b is an integer ranging from 1 to 100, and c is an integer ranging from 1 to 50.

The pyridone azo-based compound may be present in an amount of about 1 to about 80 parts by weight based on about 100 parts by weight of the pigment.

Examples of the pigment may include without limitation C.I. yellow pigment 138, C.I. yellow pigment 139. C.I. yellow pigment 150, C.I. yellow pigment 185, and the like, and combinations thereof and may further include C.I. green pigment 36, C.I. green pigment 58, C.I. red pigment 177, C.I. red pigment 254, and the like, and combinations thereof.

The pyridone azo-based compound (A) may be present in an amount of about 1 to about 80 parts by weight based on about 100 parts by weight of the pigment (B), the binder resin (C) may be present in an amount of about 1 to about 80 parts by weight based on about 100 parts by weight of the pigment (B), the dispersing agent (D) may be present in an amount of about 10 to about 80 parts by weight based on about 100 parts by weight of the pigment (B), and the solvent (E) may be present in an amount of about 10 to about 1000 parts by weight based on about 100 parts by weight of the pigment (B).

According to another embodiment, a photosensitive resin composition including the pigment dispersion composition is provided.

According to yet another embodiment, a color filter prepared using the photosensitive resin composition is provided.

Hereinafter, further embodiments will be described in detail.

A color filter that can have excellent color reproducibility, high luminance and a high contrast ratio may be provided by using a pigment dispersion composition having excellent chemical resistance, heat resistance, and light resistance as well as excellent dispersion stability, and coloring properties.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" refers to one substituted with a substituent including halogen (F, Cl, Br, I), a hydroxy group, C1 to C20 alkoxy, a nitro group, a cyano group, an amino group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, C1 to C20 alkyl, C2 to C20 alkenyl, C2 to C20 alkynyl, C6 to C30 aryl, C3 C20 cycloalkyl, C3 to C20 cycloalkenyl, C3 to C20 cycloalkynyl, C2 to C20 heterocycloalkyl, C2 to C20 heterocycloalkenyl, C2 to C20 heterocycloalkynyl, C3 to C30 heteroaryl, or a combination thereof, instead of hydrogen.

As used herein, when a specific definition is not otherwise provided, the term "alkylenearyl" may refer to C1 to C20 alkylene linked to C6 to C30 aryl, the term "arylenealkyl" may refer to C6 to C30 arylene linked to C1 to C20 alkyl, the term "alkylenearylene" may refer to C1 to C20 alkylene linked to C6 to C30 arylene, and the term "arylenealkylene" may refer to C6 to C30 arylene linked to C1 to C20 alkylene.

As used herein, when a definition is not otherwise provided, the term "hetero" refers to one including at least one hetero atom including N, O, S, P, or a combination thereof.

As used herein, when a definition is not otherwise provided, the term "(meth)acrylate" may refer to "acrylate" and "methacrylate", and "(meth)acrylic acid" may refer to "acrylic acid" and "methacrylic acid".

The pigment dispersion composition according to one embodiment includes (A) a pyridone azo-based compound, (B) a pigment, (C) a binder resin, (D) a dispersing agent, and (E) a solvent. Hereinafter, each component is described in detail.

(A) Pyridone Azo-Based Compound

The pyridone azo-based compound is a yellow-colored compound and may help coloring of a pigment which is described hereinafter. When the pyridone azo-based compound is used for a pigment dispersion composition, it may decrease the amount of a pigment, improving dispersion stability and coloring properties.

The pyridone azo-based compound may include a monomer represented by the following Chemical Formula 1, a polymer including a repeating unit represented by the following Chemical Formula 2, or a combination thereof.

[Chemical Formula 1]

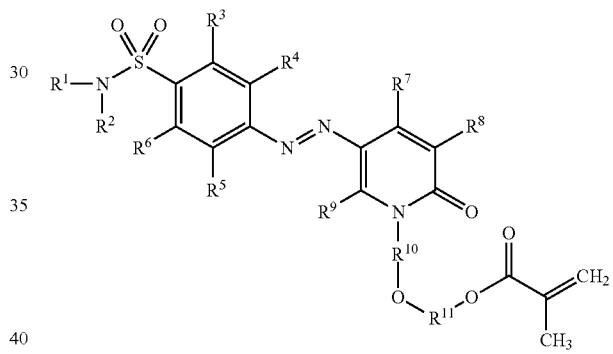

[Chemical Formula 2]

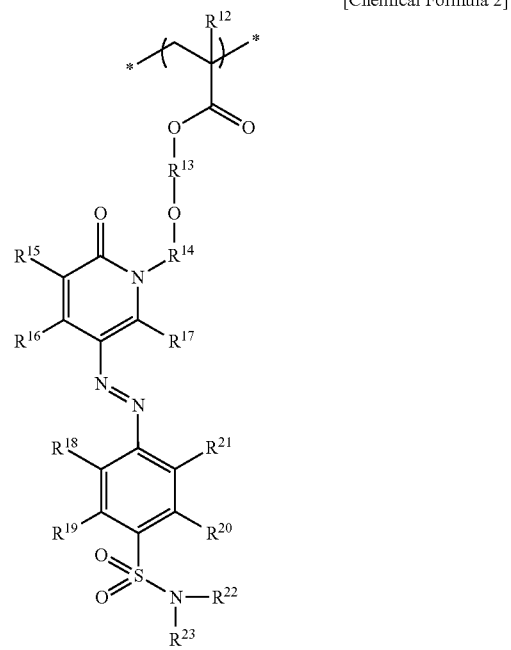

In Chemical Formulae 1 and 2, $R^1$ and $R^{22}$ are each independently hydrogen, substituted or unsubstituted C1 to C12 alkyl, a vinyl group, an amino group, a carboxyl group, or a phosphate group.

In Chemical Formulae 1 and 2, $R^2$, $R^3$ to $R^6$, $R^{18}$ to $R^{21}$ and $R^{23}$ are each independently hydrogen, substituted or unsubstituted C1 to C20 alkyl, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl.

In Chemical Formulae 1 and 2, $R^7$ to $R^9$, and $R^{15}$ to $R^{17}$ are each independently hydrogen, substituted or unsubstituted C1 to C4 alkyl, a hydroxy group, a cyano group, or a carboxyl group.

In Chemical Formulae 1 and 2, $R^{10}$, $R^{11}$, $R^{13}$, and $R^{14}$ are each independently substituted or unsubstituted C1 to C12 alkylene, substituted or unsubstituted C6 to C30 arylene, a substituted or unsubstituted alkylenearylene, or substituted or unsubstituted arylenealkylene. In one embodiment, $R^{10}$, $R^{11}$, $R^{13}$, and $R^{14}$ may be substituted or unsubstituted C1 to C12 alkylene.

A pyridone azo-based compound including the substituents above is used in a pigment dispersion composition and thus, may improve chemical resistance, heat resistance, and light resistance as well as provide excellent dispersion stability and coloring properties. Accordingly, the pigment dispersion composition may provide a color filter having high luminance and a high contrast ratio and excellent color reproducibility.

In Chemical Formulae 1 and 2, $R^{12}$ is hydrogen, substituted or unsubstituted C1 to C20 alkyl, substituted or unsubstituted C6 to C30 aryl, substituted or unsubstituted alkylenearyl, substituted or unsubstituted arylenealkyl, or substituted or unsubstituted C3 to C20 cycloalkyl.

The polymer including a repeating unit represented by Chemical Formula 2 may further include at least one repeating unit including the following Chemical Formula 3, the following Chemical Formula 4, or a combination thereof.

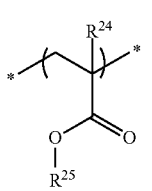

[Chemical Formula 3]

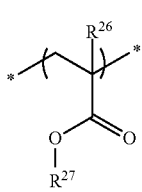

[Chemical Formula 4]

In Chemical Formulae 3 and 4, $R^{24}$ and $R^{26}$ are each independently hydrogen, substituted or unsubstituted C1 to C20 alkyl, substituted or unsubstituted C6 to C30 aryl, substituted or unsubstituted alkylenearyl, substituted or unsubstituted arylenealkyl, or substituted or unsubstituted C3 to C20 cycloalkyl.

In Chemical Formulae 3 and 4, $R^{25}$ and $R^{27}$ are different and are each independently hydrogen, halogen, hydroxy group, substituted or unsubstituted C1 to C20 alkoxy, substituted or unsubstituted C1 to C20 alkyl, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, substituted or unsubstituted C6 to C30 oxyaryl, or an amino group.

In one embodiment, $R^{25}$ and $R^{27}$ may be hydrogen, styrene, α-methylstyrene, vinyltoluene, vinylbenzylmethylether, methyl, ethyl, butyl, 2-hydroxyethyl, 2-hydroxybutyl, benzyl, cyclohexyl, 2-aminoethyl, N-phenylmaleimide, a glycol group, polyvalerolactone, N-vinylmaleimide, N-vinylpyrrolidone, 2-dimethylaminoethyl, vinyl acetate, vinyl benzoate, a glycidyl group, nitrile, amide, alkylhydroxy, polyethyleneoxyhydroxy, polypropyleneoxyhydroxy, polyethyleneoxyalkoxy, or polypropylenealkoxy.

The polymer may include the repeating unit represented by Chemical Formula 2 in an amount of about 20 mol % to about 80 mol %, for example about 30 to about 70 mol %, based on the total amount (weight) of the polymer. In some embodiments, the polymer may include a repeating unit represented by Chemical Formula 2 in an amount of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, or 80 mol %. Further, according to some embodiments of the present invention, the amount of the repeating unit represented by Chemical Formula 2 can be in a range from about any of the foregoing amounts to about any other of the foregoing amounts.

When the repeating unit is included in an amount within the above range, a pigment dispersion composition may have improved chemical resistance, heat resistance and light resistance as well as excellent dispersion stability and coloring properties.

The polymer may have a weight average molecular weight of about 3,000 to about 50,000 g/mol, for example about 5,000 to about 20,000 g/mol. The polymer may have an acid value of about 20 to about 200 mgKOH/g, for example about 50 to about 150 mgKOH/g. When the polymer has a weight average molecular weight and an acid value within the above ranges, a pigment dispersion composition may have excellent dispersion stability and coloring properties.

The pyridone azo-based compound may include at least one compound comprising a monomer represented by the following Chemical Formula 5, a polymer including a repeating unit represented by the following Chemical Formula 6, or a combination thereof.

[Chemical Formula 5]

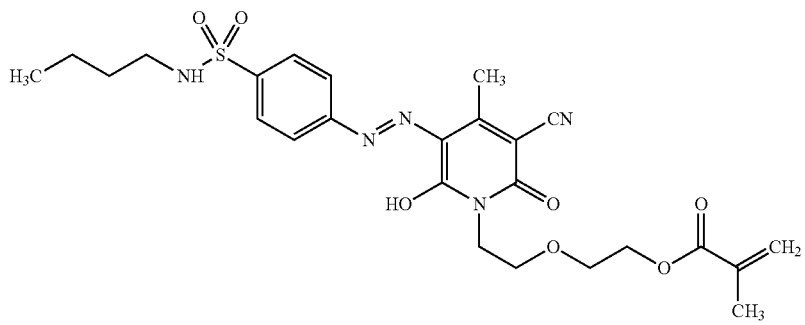

[Chemical Formula 6]

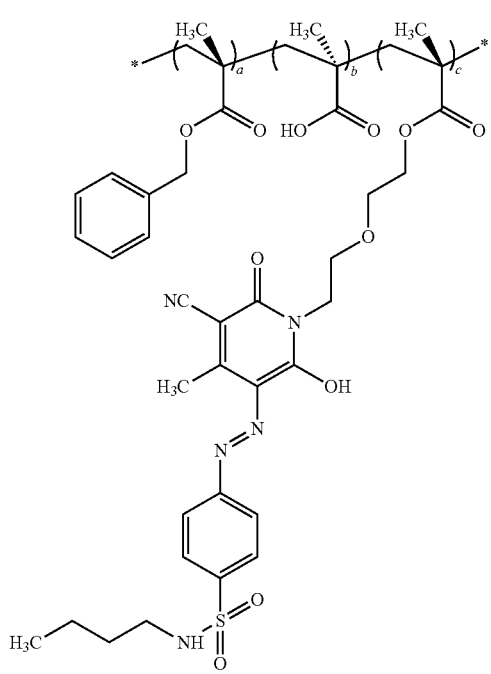

In Chemical Formula 6, a is an integer ranging from 1 to 100, b is an integer ranging from 1 to 100, and c is an integer ranging from 1 to 50.

The pyridone azo-based compound can be well dissolved in an organic solvent and thus, may have no particle or a primary particle with a diameter of less than or equal to several nanometers in the solution unlike a pigment and a pigment derivative in the form of a particle, and thus, may have high durability. In addition, the pyridone azo-based compound is a yellow-colored compound and may facilitate dispersion of a pigment and decrease the amount of a yellow pigment used. When the pyridone azo-based compound is used to prepare a pigment dispersion composition, the pigment dispersion composition may provide a color filter having high luminance and a high contrast ratio in a color coordinate such as LCD, LED, and the like.

The pyridone azo-based compound may have a maximum absorption wavelength at a wavelength region ranging from about 460 to about 560 nm and transmittance ranging from about 80 to about 100% at a wavelength region ranging from about 560 to about 660 nm in the spectrum analysis. When the pyridone azo-based compound has spectrum characteristics within the above ranges, it may accomplish high luminance.

In addition, the pyridone azo-based compound may have high heat resistance. In particular, the pyridone azo-based compound may have a thermal decomposition temperature of greater than or equal to about 250° C., for example, about 250 to about 500° C.

The pigment dispersion composition may include the pyridone azo-based compound in an amount of about 1 to about 80 parts by weight, for example about 1 to about 70 parts by weight, and as another example about 5 to about 60 parts by weight, based on about 100 parts by weight of the pigment which is described thereafter. In some embodiments, the pigment dispersion composition may include the pyridone azo-based compound in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, or 80 parts by weight. Further, according to some embodiments of the present invention, the amount of the pyridone azo-based compound can be in a range from about any of the foregoing amounts to about any other of the foregoing amounts.

When the pyridone azo-based compound is included in an amount within the above range, a pigment dispersion composition may have excellent dispersion stability and coloring properties.

(B) Pigment

The pigment may be a yellow pigment, or a mixture of a yellow pigment with a green pigment, a red pigment, or a combination thereof (i.e., a yellow pigment with a combination of a green pigment and a red pigment).

Examples of the yellow pigment may include without limitation C.I. yellow pigment 138, C.I. yellow pigment 139, C.I. yellow pigment 150, C.I. yellow pigment 185, and the like, and combinations thereof.

Examples of the green pigment may include without limitation C.I. green pigment 36, C.I. green pigment 58, and the like, and combinations thereof, and examples of the red pigment may include without limitation C.I. red pigment 177, C.I. red pigment 254, and the like, and combinations thereof.

When the pyridone azo-based compound is included in a pigment dispersion composition, the pyridone azo-based compound may decrease the amount of the pigment used and thus may provide a color filter having high luminance and high contrast ratio in a desired coordinate.

(C) Binder Resin

The binder resin may be a polymer having at least one acidic group. The acidic group may be a carboxyl group, a sulfonic acid group, or a phosphoric acid group.

Examples of the binder resin include without limitation polyacrylate-based resins such as allylmethacrylate, aminopropylacrylate, cyclohexylacrylate, phenoxyacrylate, methoxyethylacrylate, methoxydiethyleneglycolacrylate, methoxypropyleneacrylate, acrylonitrile, hydroxymethylmethacrylate, ethylmethacrylate, benzyl methacrylate, ethylhexylmethacrylate, glycerolmethacrylate, methylmethacrylate, methylacrylate, copolymers thereof, and the like, and combinations thereof.

The binder resin may have a weight average molecular weight of about 5,000 to about 40,000 g/mol, for example about 7,000 to about 20,000 g/mol. When the binder resin has a weight average molecular weight within the above range, adequate viscosity may be maintained and dispersion can be excellent.

The pigment dispersion composition may include binder resin in an amount of about 1 to about 80 parts by weight, for example about 1 to about 70 parts by weight, based on about 100 parts by weight of the pigment.

In some embodiments, the pigment dispersion composition may include the binder resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, or 80 parts by weight. Further, according to some embodiments of the present invention, the amount of the binder resin can be in a range from about any of the foregoing amounts to about any other of the foregoing amounts.

When the binder resin is included in an amount within the above range, an adequate viscosity may be maintained and dispersion can be excellent and thus optical, physical and chemical quality of articles including the binder resin may be obtained.

(D) Dispersing Agent

Examples of the dispersing agent may include without limitation polyester-based compounds, polycarboxylic acid ester-based compounds, unsaturated polyamide-based compounds, polycarboxylic acid-based compounds, polycarboxylic acid alkylamine salt compounds, polyacrylic-based compounds, polyethyleneimine-based compounds, polyurethane-based compounds, and the like. These may be used singularly or as a mixture of two or more.

The dispersing agent may have an amine value of about 20 to about 200 mgKOH/g.

Examples of commercially available dispersing agents may include without limitation DISPERBYK® 161, DISPERBYK® 163, DISPERBYK® 164, DISPERBYK® 2000, and DISPERBYK® 2001 made by BYK EFKA-4046, EFKA-4047 made by EFKA, SOLSPERSE 24000 made by Lubrizol, and the like, and combinations thereof.

The dispersing agent may be used in order to disperse the pigment in a solvent uniformly.

The pigment dispersion composition may include the dispersing agent in an amount of about 10 to about 80 parts by weight, for example about 10 to about 60 parts by weight, based on about 100 parts by weight of the pigment. In some embodiments, the pigment dispersion composition may include the dispersing agent in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, or 80 parts by weight. Further, according to some embodiments of the present invention, the amount of the dispersing agent can be in a range from about any of the foregoing amounts to about any other of the foregoing amounts.

When the dispersing agent is included in an amount within the above range, adequate viscosity may be maintained and dispersion can be excellent and thus optical, physical and chemical quality of articles may be obtained.

(E) Solvent

The solvent is not specifically limited. Examples of the solvent can include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbon such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl ester such as ethyl acetate, n-butyl acetate, isobutyl acetate, and the like; lactic acid alkyl esters such as methyl lactate, ethyl lactate, and the like; hydroxyacetic acid alkyl esters esters such as methyl hydroxyacetate, ethyl hydroxyacetate, butyl hydroxyacetate, and the like; acetic acid alkoxyalkyl esters such as methoxymethyl acetate, methoxyethyl acetate, methoxybutyl acetate, ethoxymethyl acetate, ethoxyethyl acetate, and the like; 3-hydroxypropionic acid alkyl esters such as methyl 3-hydroxypropionate, ethyl 3-hydroxypropionate, and the like; 3-alkoxypropionic acid alkyl esters such as methyl 3-methoxypropionate, ethyl 3-methoxypropionate, ethyl 3-ethoxypropionate, methyl 3-ethoxypropionate, and the like; 2-hydroxypropionic acid alkyl esters such as methyl 2-hydroxypropionate, ethyl 2-hydroxypropionate, propyl 2-hydroxypropionate, and the like; 2-alkoxypropionic acid alkyl esters such as methyl 2-methoxypropionate, ethyl 2-methoxypropionate, ethyl 2-ethoxypropionate, methyl 2-ethoxypropionate, and the like; 2-hydroxy-2-methylpropionic acid alkyl esters such as methyl 2-hydroxy-2-methylpropionate, ethyl 2-hydroxy-2-methylpropionate, and the like; 2-alkoxy-2-methylpropionic acid alkyl esters such as methyl 2-methoxy-2-methylpropionate, ethyl 2-ethoxy-2-methylpropionate, and the like; esters such as 2-hydroxyethyl propionate, 2-hydroxy-2-methylethyl propionate, hydroxyethyl acetate, methyl 2-hydroxy-3-methylbutanoate; ketonic acid esters such as ethyl pyruvate; and the like, and combinations thereof. Further examples of the solvent may include without limitation N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, and the like, and combinations thereof. These solvents may be used singularly or in a combination.

Taking into account miscibility and reactivity, exemplary solvents can include without limitation glycol ethers such as ethylene glycol monoethylether, and the like; ethylene glycol alkylether acetates such as ethyl cellosolve acetate, and the like; esters such as 2-hydroxy ethyl propionate, and the like; diethylene glycols such as diethylene glycol monomethylether, and the like; propylene glycol alkylether acetates such as propylene glycol methylether acetate, propylene glycol propylether acetate, and the like, and combinations thereof.

The pigment dispersion composition can include the solvent in an amount of about 10 to about 1000 parts by weight, for example about 200 to about 800 parts by weight, based on about 100 parts by weight of the pigment. When the solvent is present in an amount within above the range, an adequate viscosity may be maintained and dispersion can be excellent and thus optical, physical and chemical quality of articles may be obtained.

The pigment dispersion composition may have transmittance in a range of about 80 to about 95%. When the pigment dispersion composition has transmittance within this range, it may provide a color filter with excellent light transmittance and thus, provide clear colors.

According to another embodiment, a photosensitive resin composition including the pigment dispersion composition is provided. The photosensitive resin composition may include the pigment dispersion composition, an alkali soluble resin, a photopolymerization initiator, a photopolymerizable monomer, and a solvent. Hereinafter, each component is described in detail.

(1) Pigment Dispersion Composition

The pigment dispersion composition is the same as described above.

The photosensitive resin composition can include the pigment dispersion composition in an amount of about 0.1 to about 40 wt %, for example about 5 to about 35 wt %, based on the total amount (weight) of the photosensitive resin composition. In some embodiments, the photosensitive resin composition can include the pigment dispersion composition in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the pigment dispersion composition can be in a range from about any of the foregoing amounts to about any other of the foregoing amounts.

When the pigment dispersion composition is included in an amount within the above range, pattern characteristics and developability of a color filter can be improved.

(2) Alkali Soluble Resin

The alkali soluble resin is a copolymer of an ethylenic unsaturated monomer including at least one carboxyl group and another ethylenic unsaturated monomer copolymerizable with the ethylenic unsaturated monomer, and can be a resin including at least one acrylic-based repeating unit.

The first ethylenic unsaturated monomer can be an ethylenic unsaturated monomer including at least one carboxyl group. Examples of the ethylenic unsaturated monomer can include without limitation acrylic acid, methacrylic acid, maleic acid, itaconic acid, fumaric acid, and the like, and combinations thereof.

The copolymer may include the first ethylenic unsaturated monomer in an amount of about 10 to about 40 wt %, for example about 20 to about 30 wt %, based on the total weight of the alkali soluble resin. In some embodiments, the copolymer may include the first ethylenic unsaturated monomer in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the first ethylenic unsaturated monomer can be in a range from about any of the foregoing amounts to about any other of the foregoing amounts.

Examples of the second ethylenic unsaturated monomer may include without limitation aromatic vinyl compounds such as styrene, α-methylstyrene, vinyltoluene, vinylbenzylmethylether, and the like; unsaturated carboxylic acid ester compounds such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylatem and the like; unsaturated carboxylic acid amino alkyl ester compounds such as 2-aminoethyl(meth)acrylate, 2-dimethylaminoethyl(meth)acrylate, and the like; carboxylic acid vinyl ester compounds such as vinyl acetate, vinyl benzoate, and the like; unsaturated carboxylic acid glycidyl ester compounds such as glycidyl(meth)acrylate; vinyl cyanide compounds such as (meth)acrylonitrile, and the like; unsaturated amide compounds such as (meth)acrylamide, and the like. These may be used singularly or as a mixture of two or more.

Examples of the alkali soluble resin may include without limitation methacrylic acid/benzylmethacrylate copolymers, methacrylic acid/benzylmethacrylate/styrene copolymers, methacrylic acid/benzylmethacrylate/2-hydroxyethylmethacrylate copolymers, methacrylic acid/benzylmethacrylate/styrene/2-hydroxyethyl methacrylate copolymers, and the like. These may be used singularly or as a combination of two or more.

The alkali soluble resin may have a weight average molecular weight of about 3,000 to about 50,000 g/mol, for example about 5,000 to about 40,000 g/mol. When the alkali soluble resin has a weight average molecular weight within the above range, the photosensitive resin composition can have improved physical and chemical properties and suitable viscosity, which can result in improved close contacting (adhesion) properties with a substrate.

The photosensitive resin composition can include the alkali soluble resin in an amount of about 0.5 to about 30 wt %, for example about 1 to about 20 wt %, based on the total amount (weight) of the photosensitive resin composition. In some embodiments, the photosensitive resin composition can include the alkali soluble resin in an amount of about 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the alkali soluble resin can be in a range from about any of the foregoing amounts to about any other of the foregoing amounts.

When the alkali soluble resin is included in an amount within the above range, improved developability may be provided during manufacture of a color filter, and the cross-linking property can be improved to obtain excellent smooth surface properties.

(3) Photopolymerization Initiator

The photopolymerization initiator may be any conventional or generally-used photopolymerization initiator that is used in a photosensitive resin composition. Examples of the photopolymerization initiator may include without limitation acetophenone-based compounds, benzophenone-based compounds, thioxanthone-based compounds, benzoin-based compounds, triazine-based compounds, oxime-based compounds, and the like, and combinations thereof.

Examples of the acetophenone-based compound may include without limitation 2,2'-diethoxyacetophenone, 2,2'-dibutoxyacetophenone, 2-hydroxy-2-methylpropinophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and the like, and combinations thereof.

Examples of the benzophenone-based compound may include without limitation benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like, and combinations thereof.

Examples of the thioxanthone-based compound may include without limitation thioxanthone, 2-methylthioxanthone, isopropyl thioxanthone, 2,4-diethyl thioxanthone, 2,4-diisopropyl thioxanthone, 2-chlorothioxanthone, and the like, and combinations thereof.

Examples of the benzoin-based compound may include without limitation benzoin, benzoin methyl ether, benzoin ethyl ether, benzoin isopropyl ether, benzoin isobutyl ether, benzyldimethylketal, and the like, and combinations thereof.

Examples of the triazine-based compound may include without limitation 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloromethyl)-s-triazine, bis(trichloromethyl)-6-styryl-s-triazine, 2-(naphtho-1-yl)-4,6-bis(trichloromethyl)-s-triazine, 2-(4-methoxynaphtho-1-yl)-4,6-bis(trichloromethyl)-s-triazine, 2-4-trichloromethyl(piperonyl)-6-triazine, 2-4-trichloromethyl(4'-methoxystyryl)-6-triazine, and the like, and combinations thereof.

Examples of the oxime-based compound may include without limitation 2-(o-benzoyloxime)-1-[4-(phenylthio) phenyl]-1,2-octandione, 1-(o-acetyloxime)-1-[9-ethyl-6-(2-methylbenzoyl)-9H-carbazol-3-yl]ethanone, and the like, and combinations thereof.

In addition, the photopolymerization initiator may include a carbazole-based compound, a diketone-based compound, a sulfonium borate-based compound, a diazo-based compound, an imidazole-based compound, a biimidazole-based compound, and the like, and combinations thereof.

The photosensitive resin composition can include the photopolymerization initiator in an amount of about 0.1 to about 10 wt %, for example about 1 to about 5 wt %, based on the total amount (weight) of the photosensitive resin composition. In some embodiments, the photosensitive resin composition can include the photopolymerization initiator in an amount of about 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the photopolymerization initiator can be in a range from about any of the foregoing amounts to about any other of the foregoing amounts.

When the photopolymerization initiator is included in an amount within the above range, sufficient photopolymerization may be performed during the exposure in a pattern forming process for a color filter and the composition can have excellent sensitivity, which can improve transmittance.

(4) Photopolymerizable Monomer

The photopolymerizable monomer may be a multi-functional monomer having two or more hydroxy groups. Examples of the photopolymerizable monomer may include without limitation glycerolacrylate, dipentaerythritolhexaacrylate, ethyleneglycoldiacrylate, triethyleneglycoldiacrylate, 1,4-butanedioldiacrylate, 1,6-hexanedioldiacrylate, neopentylglycoldiacrylate, pentaerythritoldiacrylate, pentaerythritoltriacrylate, pentaerythritol diacrylate, dipentaerythritoltriacrylate, dipentaerythritolacrylate, pentaerythritolhexaacrylate, bisphenol-A diacrylate, trimethylolpropanetriacrylate, novolacepoxyacrylate, ethyleneglycoldimethacrylate, diethyleneglycoldimethacrylate, triethyleneglycoldimethacrylate, propyleneglycoldimethacrylate, 1,4-butanedioldimethacrylate, 1,6-hexanedioldimethacrylate, and the like, and combinations thereof.

The photosensitive resin composition can include the photopolymerizable monomer in an amount of about 0.5 to about 30 wt %, for example about 1 to about 15 wt %, based on the total amount (weight) of the photosensitive resin composition for a color filter. In some embodiments, the photosensitive resin composition can include the photopolymerizable monomer in an amount of about 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29 or 30 wt %. Further, according to some embodiments of the present invention, the amount of the photopolymerizable monomer can be in a range from about any of the foregoing amounts to about any other of the foregoing amounts.

When the photopolymerizable monomer is present in an amount within the range, pattern characteristic and developability may be excellent during fabrication of a color filter.

(5) Solvent

The solvent may be the same as the solvent (E) of the above pigment dispersion composition.

The solvent is used as a balance amount, for example about 20 to about 80 wt % based on the total amount (weight) of the photosensitive resin composition. When the solvent is present in an amount within the above range, an adequate viscosity of the photosensitive resin composition may be maintained and thus physical and optical quality of articles may be obtained.

(6) Other Additive(s)

The photosensitive resin composition may further include one or more additives. Examples of the additives include without limitation malonic acid; 3-amino-1,2-propanediol; silane-based coupling agents including a vinyl group or a (meth)acryloxy group; leveling agents; fluorine-based surfactants; radical polymerization initiators to prevent stains, improve leveling performance, and also prevent residues from being generated due to undevelopment. Such additives are known in the art and can be used in conventional amounts.

The method of manufacturing the photosensitive resin composition has no particular limitation. In exemplary embodiments, a photosensitive resin composition may be prepared by mixing the photopolymerizable monomer, the photopolymerization initiator, the alkali soluble resin, the solvent, and selectively (optionally) an additive in the pigment dispersion composition.

According to another embodiment, a color filter manufactured using the photosensitive resin composition is provided.

Such a color filter may be manufactured according to conventional and generally known methods. For example, the photosensitive resin composition can be coated on a glass substrate using a method such as spin coating, slit coating, and the like to form a coating layer having a thickness of about 1.4 to about 3.3 μm. After coating, the coating layer can be radiated by a light to form a pattern required for a color filter. Then, the coating layer can be treated with an alkali developing solution to dissolve the unradiated part and form a pattern for a color filter. These processes can be repeated as many times as needed to provide the necessary R, G, and B colors to form a color filter with a desired pattern. In addition, this image pattern may be cured by heating or exposing to radiation (an active ray) to further improve crack resistance, solvent resistance, and the like.

The color filter using the pigment dispersion composition can have a high luminance and high contrast ratio, for example can have a luminance of greater than or equal to 60 and a contrast ratio of greater than or equal to 15,000 at Gy coordinate of 0.590.

The following examples illustrate the present invention in more detail. However, it is understood that the present invention is not limited by these examples.

(Preparation of Pyridone Azo-based Compound)

PREPARATION EXAMPLE 1

Preparation of Monomer

A monomer is synthesized as shown in the following Reaction Scheme 1.

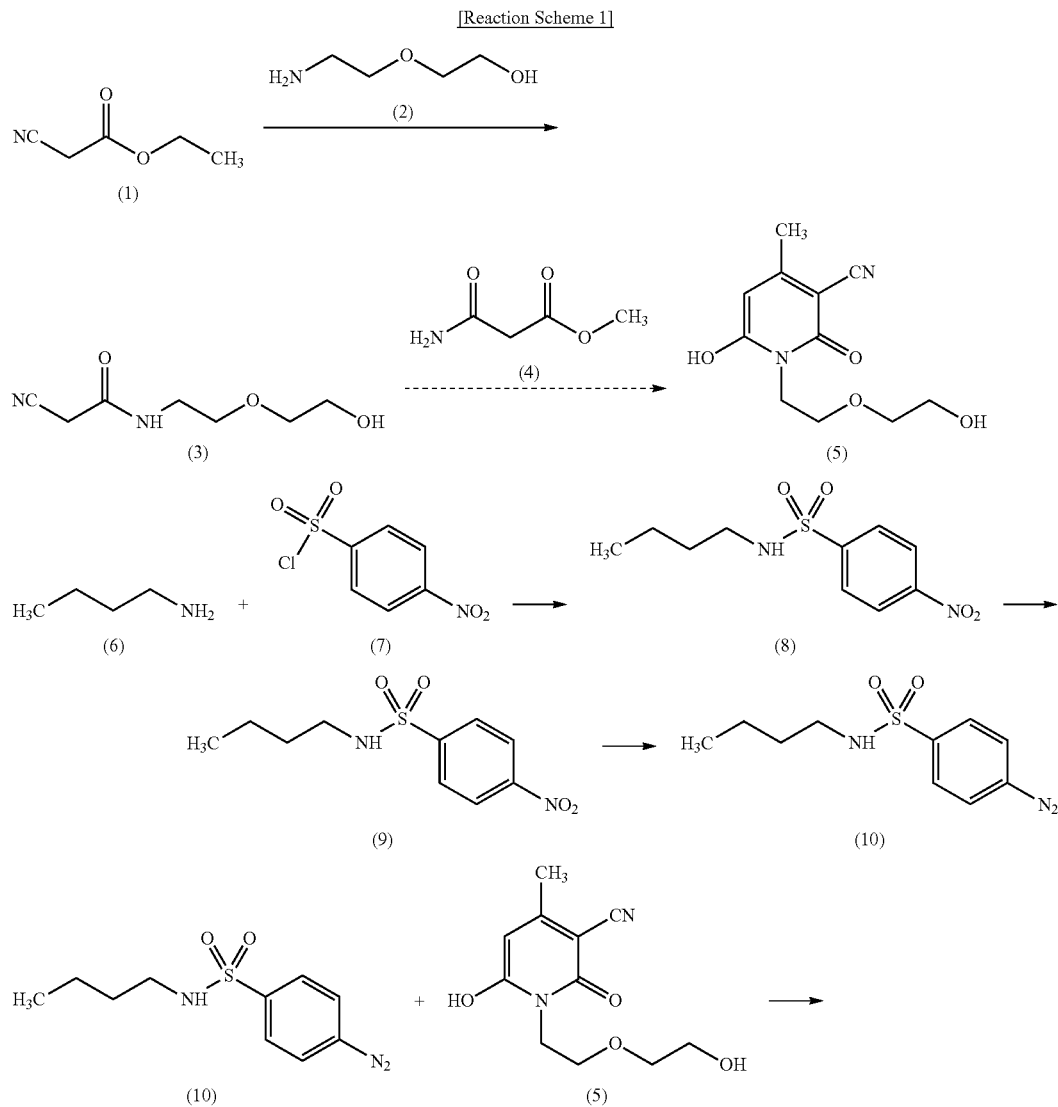

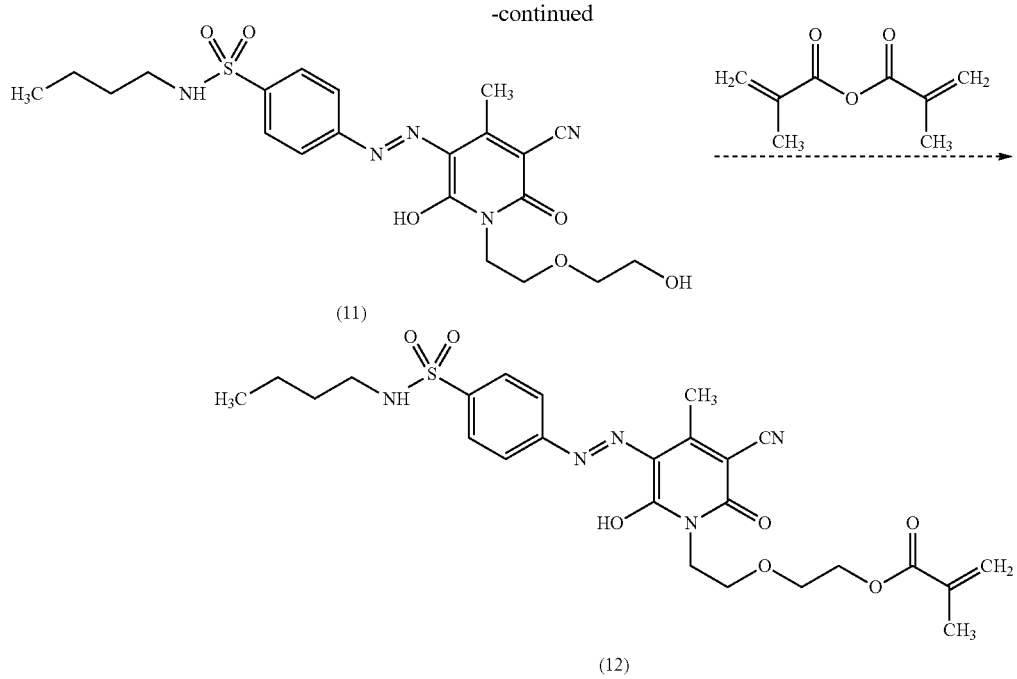

56.56 g (0.5 mol) of a compound 1 and 52.57 g (0.5 mol) of a compound 2 are reacted at 70° C. for 3 hours, obtaining a compound 3. The compound 3 is cooled down to room temperature, and 150 ml of ethanol and 69.67 g (0.6 mol) of a compound 4 are added thereto. The mixture is heated up to 45° C. Next, 220 ml (3M) of a potassium hydroxide ethanol solution is added to the mixture in a dropwise fashion. The resulting mixture is reacted at 80° C. for 7 hours. Then, a solvent in the reactant is removed, and 55 g of sodium chloride (NaCl) is added thereto. A precipitate formed therein is filtered and removed. The resulting reactant is dried to remove a solvent therein using magnesium sulfate ($MgSO_4$), obtaining 114.80 g of a compound 5 (yield: 96.4%).

26.33 g (0.36 mol) of a compound 6, 66.49 g (0.3 mol) of a compound 7, and 150 ml of orthodichlorobenzene are mixed and heated up to 60° C. Then, 15 ml of a sodium carbonate aqueous solution with 10M of a concentration is added to the above reactant in a dropwise fashion. The mixture is agitated for 30 minutes. The mixture is further agitated for 2 hours, cooled down to a room temperature, filtered, and cleaned with water, obtaining 73.2 g of a compound 8 (yield: 94.5%).

30.2 g of reduced iron, 22.0 g of acetic acid, and 63.0 g of water are mixed and agitated at 80° C. Then, 25.83 g of the compound 8 is gradually added to the resulting mixture, and 100.0 ml of ethanol is added thereto in a dropwise fashion. Next, the resulting mixture is agitated at 80° C. for 1 hour. The agitated mixture is cooled down to a room temperature, 26.0 g of sodium carbonate is added thereto, and 200 ml of methanol is further added thereto. The mixture is agitated for 30 minutes. The agitated mixture is filtered using a celite, cleaned with acetone, and a solvent therein was removed. The resulting reactant is dissolved in 500 ml of acetone, and an unsolvable material is removed therefrom. In addition, the reaction solution is dried using sodium sulfate and concentrated, obtaining 18.2 g of a compound 9 (yield: 79%).

11.42 g of the compound 9, 48 ml of 36% hydrochloric acid, and 210 ml of distilled water are mixed, and the mixture is cooled down to 0° C. Then, a sodium nitrate aqueous solution (including 3.35 g of $NaNO_2$ and 40 g of water) is added to the mixture in a dropwise fashion while the mixture is maintained at less than or equal to 5° C. The resulting mixture is agitated for 3 hours, obtaining a compound 10, while maintained at a temperature ranging from 5 to 10° C.

14.3 g of the compound 5 and 90 g of water are mixed, and 2N sodium hydroxide aqueous solution is added thereto to adjust its pH into 8. Then, the compound 10 is slowly added to the solution in a dropwise fashion at less than or equal to 0° C. Then, a 10% sodium carbonate aqueous solution is added in a dropwise fashion to the obtained reactant to adjust its pH in a range of 6 to 7. The resulting mixture is filtered and dissolved in 500 ml of acetone, and activated carbon and sodium sulfate are added thereto. The mixture is filtered using a celite. Then, a solvent is removed from the solution, and a solid is vacuumdried, obtaining 14.10 g of a compound 11 (a yield: 58.8%).

9.59 g of the compound 11, 6.07 g of triethylamine, 2.93 g of N,N-dimethylaminopyridine, and 6.17 g of methacrylic acidanhydride are dissolved in 100 Ml of acetonitrile and reacted at a room temperature for 6 hours, and an excess amount of distilled water is added thereto for precipitation. The precipitate is filtered, washed with distilled water, and dried, obtaining 9.88 g of a compound 12 (yield: 90.2%).

PREPARATION EXAMPLE 2

Preparation of Polymer 1000 g of cyclohexanone (Shiny Chemical Industrial Co., Ltd.) is heated up to 80° C. in a 10 l polymerization reactor having a reflux cooler and an agitator, and a solution prepared by dissolving 300 g of the compound 12, 300 g of benzyl methacrylate (Hitach Ltd.), 106 g of methacrylic acid (Daejung Chemicals & metals Co. Ltd.) and 92 g of 2,2'-azobisisobutyronitrile (Wako Inc.) in 5000 g of cyclohexanone (Shiny Chemical Industrial Co., Ltd.) is slowly added to the heated polymerization reactor for 3 hours. Then, the mixture is agitated for 14 hours, obtaining a polymer including a repeating unit represented by the following Chemical Formula 6-1. The polymer has a weight average molecular weight of 9,800 g/mol, determined using a gel permission chromatography (GPC) (Waters Co.).

[Chemical Formula 6-1]

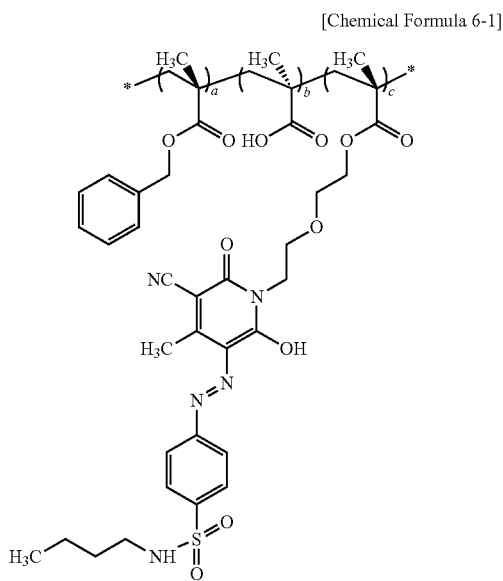

In Chemical Formula 6-1, a=2, b=2 and c=1.
(Preparation of Pigment Dispersion Composition)

EXAMPLES 1 TO 8 AND COMPARATIVE EXAMPLES 1 TO 4

The compositions provided in the following Table 1 according to Examples 1 to 4 and Comparative Examples 1 and 2 are respectively dispersed with a bead mill for 6 hours, preparing a pigment dispersion composition. In addition, the compositions provided in the following Table 1 according to Examples 5 to 8 and Comparative Exampled 3 and 4 are dispersed for 10 hours with a bead mill, preparing a pigment dispersion composition.

(A) Pyridone Azo-based Compound
(A-1) The monomer of Preparation Example 1 is used.
(A-2) The monomer of Preparation Example 2 is used.
(B) Pigment
(B-1) C.I. yellow pigment 150 is used.
(B-2) C.I. yellow pigment 138 is used.
(B-3) C.I. green pigment 58 is used.
(C) Binder Resin
A polybenzylmethacrylate resin (Miwon Commercial Co., Ltd, NPR1520) is used in an amount of 30 parts by weight.
(D) Dispersing Agent
A polyester dispersing agent (EFKA 4046 made by EFKA) is used.
(E) Solvent
Propylene glycol methylethylacetate (Sigma-Aldrich) is used.

TABLE 1

(unit: g)

|     |     | Example |    |    |    |    |    |    |    | Comparative Example |    |    |    |
|-----|-----|---------|----|----|----|----|----|----|----|---|----|----|----|
|     |     | 1 | 2 | 3 | 4 | 5 | 6 | 7 | 8 | 1 | 2 | 3 | 4 |
| (A) | A-1 | 5 | — | 5 | — | 5 | — | 5 | — | — | — | — | — |
|     | A-2 | — | 5 | — | 5 | — | 5 | — | 5 | — | — | — | — |
| (B) | B-1 | 10 | 10 | — | — | 4 | 4 | — | — | 15 | — | 6 | — |
|     | B-2 | — | — | 10 | 10 | — | — | 4 | 4 | — | 15 | — | 6 |
|     | B-3 | — | — | — | — | 6 | 6 | 6 | 6 | — | — | 9 | 9 |
| (C) |     | 3 | 3 | 3 | 3 | 3 | 3 | 3 | 3 | 3 | 3 | 3 | 3 |
| (D) |     | 4 | 4 | 4 | 4 | 4 | 4 | 4 | 4 | 4 | 4 | 4 | 4 |
| (E) |     | 55 | 55 | 55 | 55 | 55 | 55 | 55 | 55 | 55 | 55 | 55 | 55 |

Evaluation 1: Color Characteristic Evaluation of Pigment Dispersion Composition

Luminance and contrast ratio of the pigment dispersion compositions according to Examples 1 to 8 and Comparative Examples 1 to 4 are measured using a colorimeter and a device measuring a contrast ratio, respectively. The results are provided in the following Table 2.

TABLE 2

|  | Example |  |  |  |  |  |
|---|---|---|---|---|---|---|
|  | 1 | 2 | 3 | 4 | 5 | 6 |
| Gx | 0.253 | 0.250 | 0.262 | 0.255 | 0.305 | 0.300 |
| $\Delta$Gx | 0.013 | 0.010 | 0.012 | 0.005 | 0.015 | 0.010 |
| Gy | 0.500 | 0.500 | 0.500 | 0.500 | 0.290 | 0.590 |
| Luminance | 59.1 | 58.4 | 56.2 | 55.8 | 65.1 | 64.5 |
| Luminance increase | 6.6 | 5.9 | 1.6 | 1.2 | 5.0 | 4.4 |
| Contrast ratio | 12180 | 12100 | 10340 | 10200 | 14200 | 14120 |
| Contrast ratio increase | 1680 | 1600 | 1340 | 1200 | 1400 | 1320 |

|  | Example |  | Comparative Example |  |  |  |
|---|---|---|---|---|---|---|
|  | 7 | 8 | 1 | 2 | 3 | 4 |
| Gx | 0.316 | 0.310 | 0.240 | 0.250 | 0.290 | 0.300 |
| $\Delta$Gx | 0.016 | 0.010 | — | — | — | — |
| Gy | 0.590 | 0.500 | 0.500 | 0.500 | 0.590 | 0.590 |
| Luminance | 63.4 | 63.2 | 52.5 | 54.6 | 60.1 | 62.1 |
| Luminance increase | 1.3 | 1.1 | — | — | — | — |
| Contrast ratio | 12200 | 12090 | 10500 | 9000 | 12800 | 10900 |
| Contrast ratio increase | 1300 | 1190 | — | — | — | — |

Referring to Table 2, the pigment dispersion compositions including the same pigment, that is, C.I. yellow pigment 150 according to Examples 1 and 2 have more yellow color coordinate ($\Delta Gx$) than the one according to Comparative Example 1 and thus, excellent coloring properties and improved luminance and contrast ratio.

Likewise, the pigment dispersion compositions including the same pigment, that is, C.I. yellow pigment 138 according to Examples 3 and 4 have excellent coloring properties and high luminance and contrast ratio compared with the one according to Comparative Example 2.

In addition, the pigment dispersion compositions including the same pigment, that is, a mixture of C.I. yellow pigment 150 and C.I. green pigment 58 according to Examples 5 and 6 have excellent coloring properties and high luminance and contrast ratio compared with the one according to Comparative Example 3.

Furthermore, the pigment dispersion compositions including the same pigment, that is, a mixture of C.I. yellow pigment 138 and C.I. green pigment 58 according to Examples 7 and 8 have excellent coloring properties and high luminance and contrast ratio compared with the one according to Comparative Example 4.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

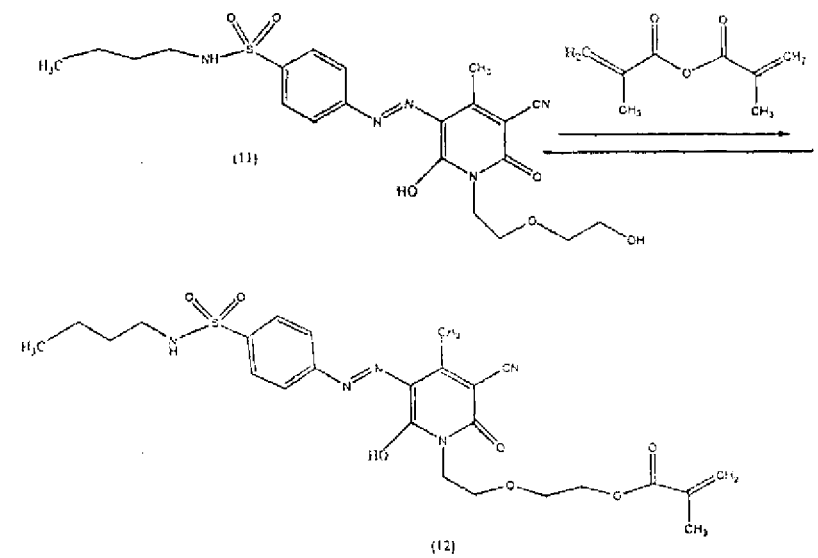

What is claimed is:

1. A pigment dispersion composition, consisting essentially of:
   (A) at least one pyridone azo-based compound comprising a monomer represented by the following Chemical Formula 1, a polymer including a repeating unit represented by the following Chemical Formula 2, or a combination thereof;
   (B) a pigment;
   (C) a binder resin;
   (D) a dispersing agent; and
   (E) a solvent:

[Chemical Formula 1]

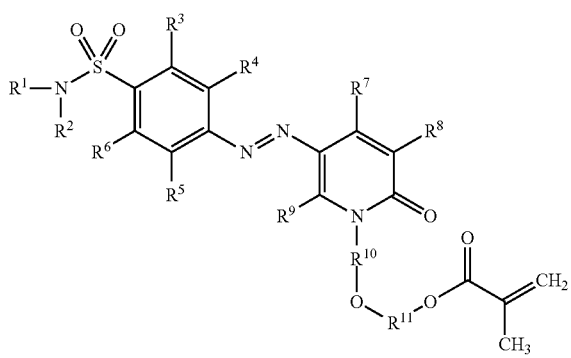

[Chemical Formula 2]

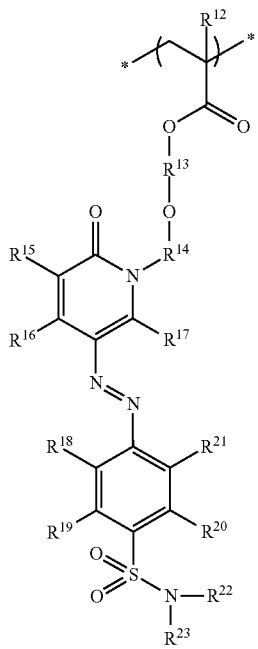

wherein, in Chemical Formulae 1 and 2, $R^1$ and $R^{22}$ are each independently hydrogen, substituted or unsubstituted C1 to C12 alkyl, a vinyl group, an amino group, a carboxyl group, or a phosphate group, $R^2$, $R^3$ to $R^6$, $R^{18}$ to $R^{21}$, and $R^{23}$ are each independently hydrogen, substituted or unsubstituted C1 to C20 alkyl, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl, $R^7$ to $R^9$ and $R^{15}$ to $R^{17}$ are each independently hydrogen, substituted or unsubstituted C1 to C4 alkyl, a hydroxy group, a cyano group, or a carboxyl group, $R^{10}$, $R^{11}$, $R^{13}$ and $R^{14}$ are each independently substituted or unsubstituted C1 to C12 alkylene, substituted or unsubstituted C6 to C30 arylene, substituted or unsubstituted alkylenearylene, or substituted or unsubstituted arylenealkylene, and $R^{12}$ is hydrogen, substituted or unsubstituted C1 to C20 alkyl, substituted or unsubstituted C6 to C30 aryl, substituted or unsubstituted alkylenearyl, substituted or unsubstituted arylenealkyl, or substituted or unsubstituted C3 to C20 cycloalkyl.

2. The pigment dispersion composition of claim 1, wherein the polymer including a repeating unit represented by Chemical Formula 2 further comprises at least one repeating unit selected from the following Chemical Formula 3, the following Chemical Formula 4, or a combination thereof:

[Chemical Formula 3]

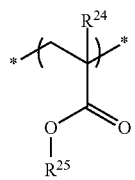

25

-continued

[Chemical Formula 4]

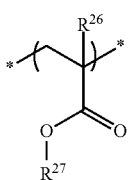

wherein, in Chemical Formulae 3 and 4, $R^{24}$ and $R^{26}$ are each independently hydrogen, substituted or unsubstituted C1 to C20 alkyl, substituted or unsubstituted C6 to C30 aryl, substituted or unsubstituted alkylenearyl, substituted or unsubstituted arylenealkyl, or substituted or unsubstituted C3 to C20 cycloalkyl, and $R^{25}$ and $R^{27}$ are different, and are each independently hydrogen, halogen, hydroxy group, substituted or unsubstituted C1 to C20 alkoxy, substituted or unsubstituted C1 to C20 alkyl, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, substituted or unsubstituted C6 to C30 oxyaryl, or amino group.

3. The pigment dispersion composition of claim 2, wherein the repeating unit represented by Chemical Formula 2 is present in an amount of about 20 mol % to about 80 mol % based on the total amount of the polymer.

4. The pigment dispersion composition of claim 1, wherein the polymer has a weight average molecular weight of about 3,000 to about 50,000 g/mol.

5. The pigment dispersion composition of claim 1, wherein the polymer has an acid value of about 20 to about 200 mgKOH/g.

6. The pigment dispersion composition of claim 1, wherein the pyridone azo-based compound comprises at least one compound comprising a monomer represented by the following Chemical Formula 5, a polymer including a repeating unit represented by the following Chemical Formula 6, or a combination thereof:

[Chemical Formula 5]

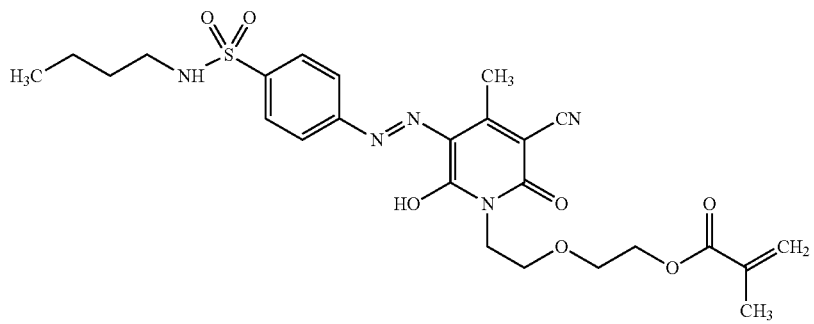

[Chemical Formula 6]

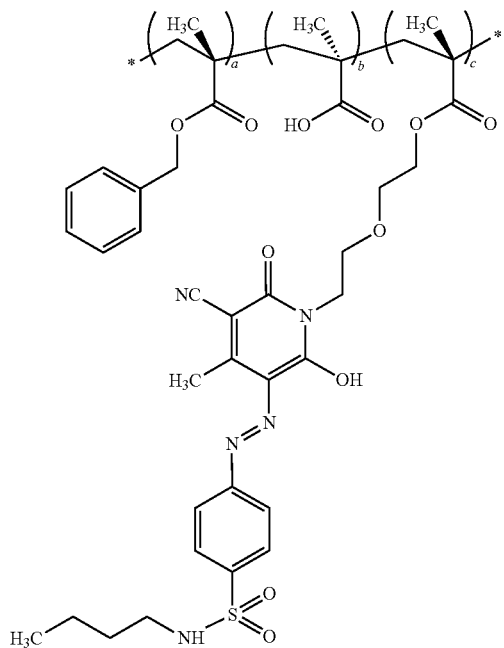

wherein, in Chemical Formula 6, a is an integer ranging from 1 to 100, b is an integer ranging from 1 to 100, and c is an integer ranging from 1 to 50.

7. The pigment dispersion composition of claim 1, wherein the pyridone azo-based compound is present in an amount of about 1 to about 80 parts by weight based on about 100 parts by weight of the pigment.

8. The pigment dispersion composition of claim 1, wherein the pigment comprises C.I. yellow pigment 138, C.I. yellow pigment 139. C.I. yellow pigment 150, C.I. yellow pigment 185, or a combination thereof.

9. The pigment dispersion composition of claim 8, wherein the pigment further comprises C.I. green pigment 36, C.I. green pigment 58, C.I. red pigment 177, C.I. red pigment 254, or a combination thereof.

10. The pigment dispersion composition of claim 1, consisting essentially of:
   the pyridone azo-based compound (A) in an amount of about 1 to about 80 parts by weight based on about 100 parts by weight of the pigment (B),
   the binder resin (C) in an amount of about 1 to about 80 parts by weight based on about 100 parts by weight of the pigment (B),
   the dispersing agent (D) in an amount of about 10 to about 80 parts by weight based on about 100 parts by weight of the pigment (B), and
   the solvent (E) in an amount of about 10 to about 1000 parts by weight based on about 100 parts by weight of the pigment (B).

11. A photosensitive resin composition comprising the pigment dispersion composition according to claim 1.

12. A color filter manufactured using the photosensitive resin composition according to claim 11.

13. The photosensitive resin composition of claim 11, wherein the photosensitive resin composition further comprises an alkali soluble resin, a photopolymerizable monomer, photopolymerizable initiator, and solvent.

14. The photosensitive resin composition of claim 11, comprising:
   about 0.1 to about 40 wt % of the pigment dispersion composition;
   about 0.5 to about 30 wt % of the alkali soluble resin,
   about 0.5 to about 30 wt % of the photopolymerizable monomer;
   about 0.1 to about 10 wt % of the photopolymerizable initiator; and
   a balance amount of the solvent.

15. A pigment dispersion composition consisting of:
   (A) at least one pyridone azo-based compound comprising a monomer represented by the following Chemical Formula 1, a polymer including a repeating unit represented by the following Chemical Formula 2, or a combination thereof;
   (B) a pigment;
   (C) a binder resin;
   (D) a dispersing agent; and
   (E) a solvent:

[Chemical Formula 1]

[Chemical Formula 2]

wherein, in Chemical Formulae 1 and 2,
$R^1$ and $R^{22}$ are each independently hydrogen, substituted or unsubstituted C1 to C12 alkyl, a vinyl group, an amino group, a carboxyl group, or a phosphate group,
$R^2$, $R^3$ to $R^6$, $R^{18}$ to $R^{21}$, and $R^{23}$ are each independently hydrogen, substituted or unsubstituted C1 to C20 alkyl, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl,
$R^7$ to $R^9$ and $R^{15}$ to $R^{17}$ are each independently hydrogen, substituted or unsubstituted C1 to C4 alkyl, a hydroxy group, a cyano group, or a carboxyl group,
$R^{10}$, $R^{11}$, $R^{13}$ and $R^{14}$ are each independently substituted or unsubstituted C1 to C12 alkylene, substituted or unsubstituted C6 to C30 arylene, substituted or unsubstituted alkylenearylene, or substituted or unsubstituted arylenealkylene, and
$R^{12}$ is hydrogen, substituted or unsubstituted C1 to C20 alkyl, substituted or unsubstituted C6 to C30 aryl, substituted or unsubstituted alkylenearyl, substituted or unsubstituted arylenealkyl, or substituted or unsubstituted C3 to C20 cycloalkyl.

16. A photosensitive resin composition comprising a pigment dispersion composition, an alkali soluble resin, a photopolymerizable monomer, a photopolymerizable initiator, and solvent, wherein said pigment dispersion composition comprises:
- (A) at least one pyridone azo-based compound comprising a monomer represented by the following Chemical Formula 1, a polymer including a repeating unit represented by the following Chemical Formula 2, or a combination thereof;
- (B) a pigment;
- (C) a binder resin;
- (D) a dispersing agent; and
- (E) a solvent:

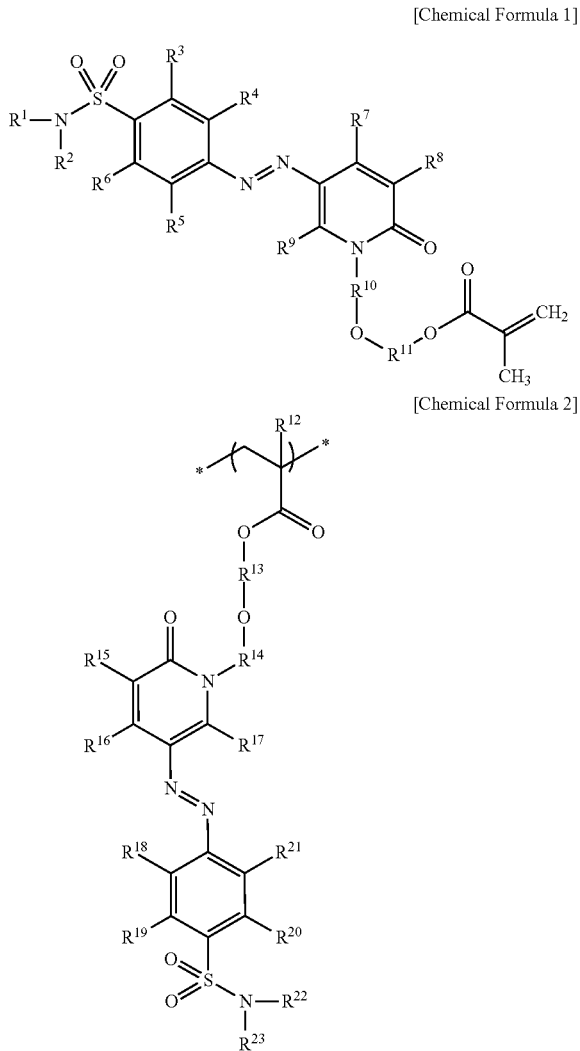

wherein, in Chemical Formulae 1 and 2, $R^1$ and $R^{22}$ are each independently hydrogen, substituted or unsubstituted C1 to C12 alkyl, a vinyl group, an amino group, a carboxyl group, or a phosphate group, $R^2$, $R^3$ to $R^6$, $R^{18}$ to $R^{21}$, and $R^{23}$ are each independently hydrogen, substituted or unsubstituted C1 to C20 alkyl, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl, $R^7$ to $R^9$ and $R^{15}$ to $R^{17}$ are each independently hydrogen, substituted or unsubstituted C1 to C4 alkyl, a hydroxy group, a cyano group, or a carboxyl group, $R^{10}$, $R^{11}$, $R^{13}$ and $R^{14}$ are each independently substituted or unsubstituted C1 to C12 alkylene, substituted or unsubstituted C6 to C30 arylene, substituted or unsubstituted alkylenearylene, or substituted or unsubstituted arylenealkylene, and $R^{12}$ is hydrogen, substituted or unsubstituted C1 to C20 alkyl, substituted or unsubstituted C6 to C30 aryl, substituted or unsubstituted alkylenearyl, substituted or unsubstituted arylenealkyl, or substituted or unsubstituted C3 to C20 cycloalkyl.

17. The photosensitive resin composition of claim 16, comprising:

about 0.1 to about 40 wt % of the pigment dispersion composition;

about 0.5 to about 30 wt % of the alkali soluble resin, about 0.5 to about 30 wt % of the photopolymerizable monomer;

about 0.1 to about 10 wt % of the photopolymerizable initiator; and a balance amount of the solvent.

* * * * *

UNITED STATES PATENT AND TRADEMARK OFFICE
CERTIFICATE OF CORRECTION

PATENT NO. : 8,828,631 B2  
APPLICATION NO. : 13/591484  
DATED : September 9, 2014  
INVENTOR(S) : Kyung-Hee Hyung et al.

Page 1 of 3

It is certified that error appears in the above-identified patent and that said Letters Patent is hereby corrected as shown below:

In the Specification

Columns 17 and 18, Lines 21-67 depict Reaction Scheme 1 as:

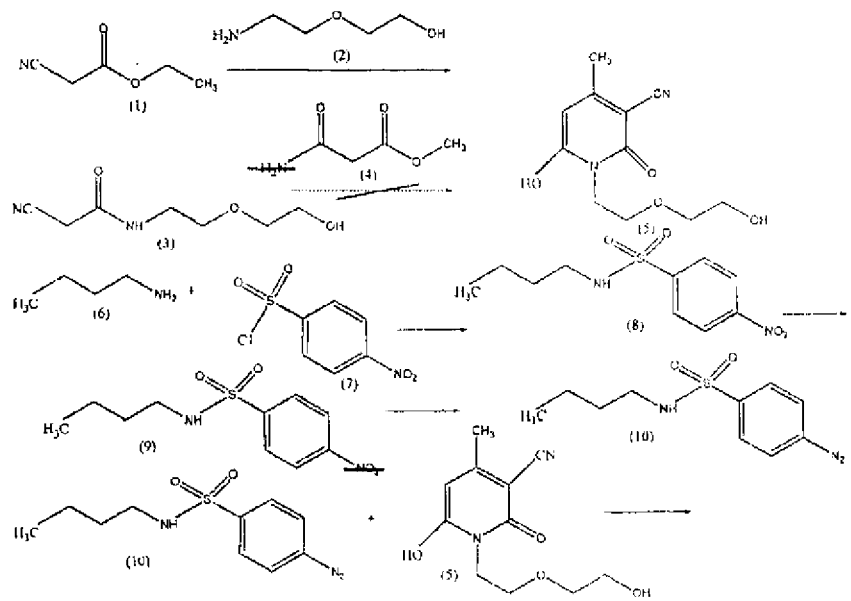

Signed and Sealed this  
Fourteenth Day of April, 2015

Michelle K. Lee  
*Director of the United States Patent and Trademark Office* and should be depicted as:
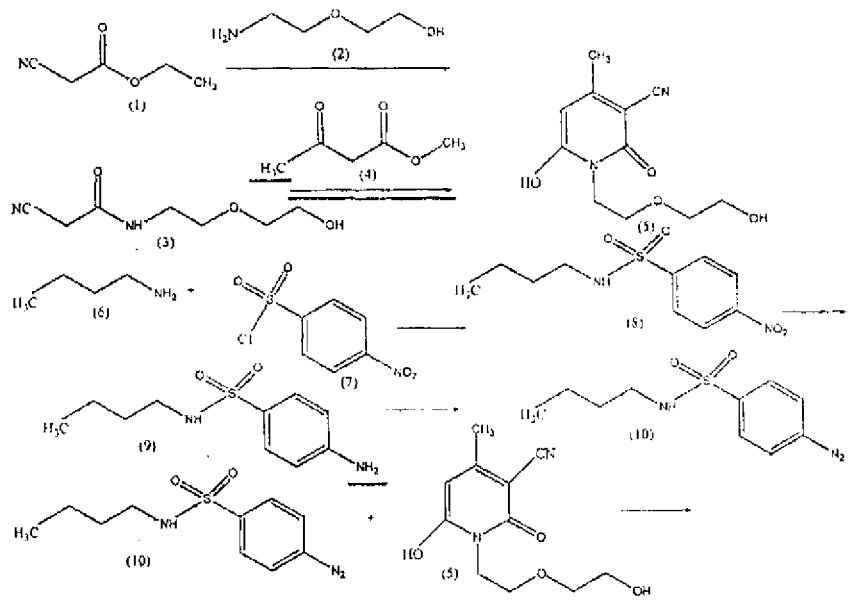
Columns 19 and 20, Lines 1-28 depict continued Reaction Scheme 1 as:
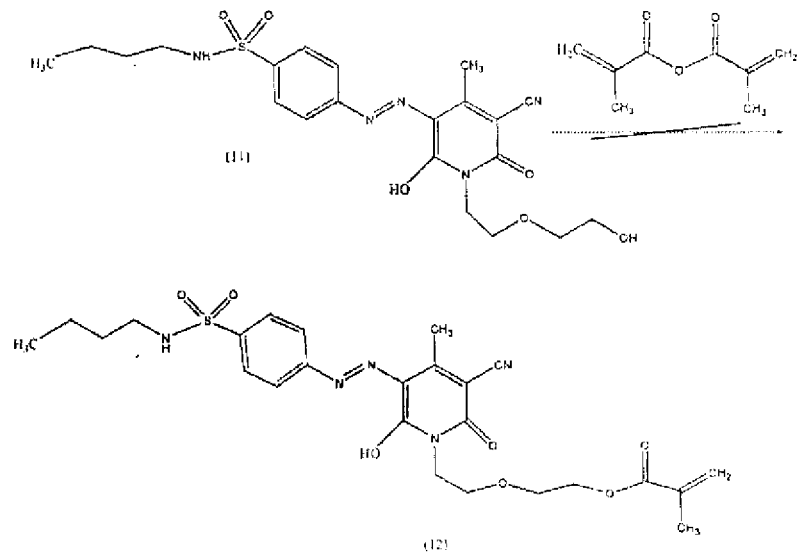

CERTIFICATE OF CORRECTION (continued)
U.S. Pat. No. 8,828,631 B2 and should be depicted as: